United States Patent [19]

Claes et al.

[11] 3,966,517

[45] June 29, 1976

[54] MANUFACTURING SEMICONDUCTOR DEVICES IN WHICH SILICON SLICES OR GERMANIUM SLICES ARE ETCHED AND SEMICONDUCTOR DEVICES THUS MANUFACTURED

[75] Inventors: Hendrik Armand Denis Claes, Deurne, Belgium; Wolter Geppienus Gelling, Eindhoven, Netherlands

[73] Assignee: U.S. Philips Corporation, New York, N.Y.

[22] Filed: Sept. 30, 1974

[21] Appl. No.: 510,492

[30] Foreign Application Priority Data
Oct. 3, 1973  Netherlands................... 7313572

[52] U.S. Cl..................................... 156/7; 29/580; 156/17; 252/79.3
[51] Int. Cl.$^2$............................... H01L 21/306
[58] Field of Search............. 156/7, 17, 3; 252/79.3; 29/580

[56] References Cited
UNITED STATES PATENTS

| | | |
|---|---|---|
| 3,677,848 | 7/1972 | Stoller et al. ...................... 156/17 |
| 3,716,425 | 2/1973 | Davidsohn ........................... 156/17 |
| 3,762,973 | 10/1973 | Gabrail................................ 156/17 |
| 3,844,859 | 10/1974 | Roni .................................. 252/79.2 |

*Primary Examiner*—William A. Powell
*Assistant Examiner*—Jerome W. Massie
*Attorney, Agent, or Firm*—Frank R. Trifari; Norman N. Spain

[57] ABSTRACT

Thinning plate-shaped bodies of silicon or germanium, adhered to a glass-plate by chemically etching in an etchant comprising hydrofluoric acid and at least one oxidant, in which, prior to said etching, the etchant is given a content of silicon. This silicon may be added in several forms, for instance as silicon oxide in readily accessible form or by dissolving some elemental silicon. It is further possible for a similar process to use an etchant comprising the above etchant after first use. The method may be used in the manufacture of semiconductor devices.

12 Claims, No Drawings

MANUFACTURING SEMICONDUCTOR DEVICES IN WHICH SILICON SLICES OR GERMANIUM SLICES ARE ETCHED AND SEMICONDUCTOR DEVICES THUS MANUFACTURED

The invention relates to manufacturing semiconductor devices in which silicon slices or germanium slices are etched and further relates to semiconductor devices thus manufactured. In such etching treatments it is known to use acid etchants which contain fluoride ions and an oxidizing agent. The oxidizing agent serves to ionize the silicon atoms or germanium atoms and the fluoride ions serve to dissolve the silicon ions or germanium ions. The fluorine ions are generally supplied by hydrofluoric acid. Particularly well-known oxidizing agents in such etchants are nitric acid and hydrogen peroxide. If desired, still other constituents may be used in the aqueous solution which exert a more stabilizing and/or activating and/or regulating action, for example acetic acid, iodine, and so on. Such etching treatments are used, for example, to etch the above mentioned slices to a desired thickness or to give them a clean/or smooth surface. According to a method of etching, the slices are adhered with one side on a support and the other side is subjected to the etching treatment. Such supports should be reasonably resistent to the strongly agressive etchant or at least not to be attacked too rapidly by it. The same applies to the adhesive with which the slices are secured to the supports. In that case also the support and the adhesive should satisfy sufficient quality requirements, for example, as regards a sufficient resistance to further agressive chemicals used, to mechanical manipulations and possible other treatments, for example, treatments at not too high temperatures, vacuum treatments, and so on. It may also be desirable, in particular in the case of the local presence of parts of semiconductor devices provided already previously on the side of the support, that a transparent support be used so that, for example, the location of said parts can be established without removing the slice from the support.

In order to meet these requirements one often has to resort to adhesives which have a comparatively great hardness and which, for connecting the slice to the support, require a comparatively high temperature to be sufficiently liquid.

To be considered in particular for the support are vitreous materials on the basis of silicon oxide and silicates. Although such materials can be attacked by hydrofluoric acid, it has been found that they dissolve sufficiently slowly in the above mentioned acid etchants to be useful in practice as a support in the above mentioned etching treatments. This holds good in particular for etchants of which the content of the oxidizing agent is sufficiently high as compared with the content of hydrofluoric acid.

Vitreous materials on the basis of silicon oxide and silicates are comparatively hard. In connection with the hardness of the adhesive used and the comparatively high adhering temperature, for example, of at least 100°C, undesired mechanical stresses may occur due to a difference in coefficient of expansion between the semiconductor slice and the glass support and may give rise to serious structural defects in the semiconductor slices or damages, possibly even associated with fracture of the slice and/or the support. It has been found for example, that a support of quartz is less suitable and the use of a glass support having a coefficient of expansion which is better adapted to the semiconductor material of the slice is to be preferred.

It has now been found that upon thin-etching of slices of silicon or germanium provided on a glass support while using the above mentioned etches, the depth of etching is not uniform throughout the surface of the slice. In particular in a large diameter slices, for example of more than 1 cm, considerable differences occur as a result of which originally flat surfaces may be bent concave, convex or otherwise, in which, for example, an original uniform thickness may be annoying in further processing the slice in the manufacture of semiconductor devices. This may be the case, for example, when parts of semiconductor circuit elements or integrated circuits have to be provided locally in an accurate and reproduceable manner, by means of conventional photoresist methods on the etched side where the surface has not remained entirely flat. Furthermore, a variation in the thickness of the slice may be detrimental to the semiconductor devices to be manufactured or to treatments for the manufacture thereof.

For example, in a target of silicon or germanium for a camera tube a uniform absorption for any type of radiation which is incident on the side opposite to the scanning side both in regard to the extent of said absorption and in regard to the distance between the places of which absorption occurs to the nearest pn-junctions on the scanning side is desired.

It may furthermore be necessary to perform treatments on both sides of the whole slice which have to be accurately correlated with each other, for example, the provision on either side of zones of certain conductivity properties co-operating with each other or the separation of semiconductor parts with different circuit units provided on the side with which the slice is secured to the support by providing grooves from the oppositely located side of the slice.

One of the objects of the invention is to mitigate the above mentioned drawbacks.

According to a first aspect of the invention, a method of manufacturing semiconductor devices in which at least one silicon slice or germanium slice is secured with one side to a glass support and is thereafter chemically etched in an etching bath consisting of an acid etchant containing hydrofluoric acid and at least one oxidizing agent, said etchant having not been used in a similar etching treatment is characterized in that prior to the etching treatment the etching bath is given a content of silicon. It has been found that in this case also slices having dimensions of at least 1 cm, for example, disc-shaped slices having diameters of from 2.5 to 10 cm, can be uniformly etched throughout the slice within narrow tolerances, for example, with differences of less than 5% of the thickness of the etch material, removed by the etching treatment.

The silicon may be added to the etchant in various manners. According to a preferred embodiment the silicon may be added in an oxidized and also readily accessible form, for example as a silica gel, or silicon oxide in a very finely divided form, that is to say having preferably a grain size smaller than 0.1 $\mu$m or at least having a porosity corresponding with such a grain size as regards the surface-to-volume ratio. Such finely divided materials are commercially available.

In principle silicon may also be added to the etching liquid from the gaseous phase, for example, as silicon tetrafluoride. It is simpler, however, to use silicon tetrafluoride dissolved in concentrated hydrofluoric acid, in a liquid form.

It is also possible to dissolve some elementary silicon in the etchant by the etching action of the ionized liquid itself.

According to a second aspect of the invention a method of manufacturing semiconductor devices in which at least one silicon slice or germanium slice is secured with one side to a glass support and is thereafter chemically etched in an etching bath consisting of an acid etchant containing hydrofluoric acid and at least one oxidizing agent is characterized in that said etching bath comprises an etchant having been used in a method according to the first aspect of the invention. As such etchants of this type already contain silicon and also enable etching to a substantially uniform depth which also applies to a repeated use in the above etching treatments.

In principle the etchant may be used as such two or more times as long as the etchant still shows a sufficient reactivity. However, the reactivity decreases. According to preferred embodiments of the method according to the second aspect of the invention the already used etchant may be regenerated by replenishing the consumed quantity of components and/or mixing such a used etching liquid with an etching liquid not used.

The above mentioned equalizing effect of the dissolved silicon on the etching rate cannot be established with certainty. A possibility is that sodium ions which have been incorporated in the etching liquid by the attack of the glass support, influence the etching rate. Since a larger concentration of sodium ions in the etching liquid may be expected on the periphery of the slice due to the vicinity of exposed glass surface than in the etching liquid with more centrally located surface parts of the slice, a different etching rate would prevail in this centre than on the periphery of the slice. Normal types of glass generally contain sodium. The glass support used in the present methods according to the invention preferably consists of a type having a coefficient of expansion which is suitable for the present application and which differs at most 25% from that of the material of the slice. In particular pyrex is a suitable type of glass for silicon slices.

As regards the composition of the etchant the following may be said: an oxidation of the material of the slice by means of the oxidizing agent and a conversion of the product of the oxidation into a soluble product take place successively. The least rapid of said partial reactions determining the etch velocity. When the excess of the active hydrofluoric acid is sufficiently large with respect to the oxidizing agent the concentration of the oxidizing agent is rate-determining. When the excess of the available oxidizing agent is sufficiently large with respect to the active hydrofluoric acid, the concentration of the active hydrofluoric acid is rate-determining. However, just the concentration of the active hydrofluoric acid is important for the attack of the glass support. When in the etching liquid a high hydrofluoric acid content is chosen with respect to the content of oxidizing agent, this is less favorable in connection with the comparatively stronger attack of the glass than with choice of a high content of oxidizing agent with respect to the content of active hydrofluoric acid. Therefore the content of the oxidizing agent with respect to the content of active hydrofluoric acid is preferably chosen to be sufficiently high in order that the etching velocity of the material of the slice becomes dependent on the content of the active hydrofluoric acid. In the case in which the oxidizing agent consists of $HNO_3$, the quantity by weight of $HNO_3$ for that purpose should, according to a preferred embodiment, be more than $\frac{2}{3} x$, preferably at least $1 x$ the quantity by weight of active HF. The quantity by weight of active HF is to be understood that quantity of the original quantity of HF added as hydrofluoric acid which has not been consumed prior to the etching treatment to bind the added silicon in the form of $H_2SiF_6$, or as the case may be the silicon and/or germanium of the already used etching liquid comprised in the etchant. The quality of silicon which in practice may be used in the etching liquid prior to the etching treatment for a favourable equalizing effect on the etching of comparatively large slices is not critical. The minimum quantity of silicon need only be sufficient to bind the sodium which initially dissolves by the attack of the glass support. However, said quantity is extremely small and in practice larger quantities of silicon will generally be used in the etchant. It should furthermore be ensured that after the formation of the $H_2SiF_6$ sufficient active hydrofluoric acid remains available for the etching action.

The methods according to the invention are of particular use for the above described cases of smooth etching and thin etching in manufacturing semiconductor devices, in particular semiconductor devices such as a target of silicon or germanium for a camera tube.

A further use is the local provision on either side of parts of semiconductor devices, for example, zones and/or contacts locally provided by alloying, diffusion and/or ion implantation, the locations of which on either side of the slice have to be accurately correlated with each other.

Furthermore the invention may be useful in methods of thinning by etching parts of the slice which are already provided, at least on the side of the support with local zones, contacts and the like, after which said parts are mutually separated by local etching through in particular with anisotropic etching methods. Said anisotropic etching methods are of importance in particular for the manufacture of integrated circuits having islands, which are separated from each other by air isolation and which are connected by so-called "beam leads", that is to say conductive layers of a sufficient thickness for mechanical connecting the islands. After providing the circuit elements and the beam-leads in the silicon slice oriented according to a (100)-plane the slice after thin etching according to the invention from the side opposite to that where the circuit elements and beam-leads are provided, hereinafter termed the "rear side", is provided on said rear side with a masking pattern for the anisotropic etching of separation grooves. For the alignment of the masking pattern infrared radiation may be passed through the semiconductor slice, in which the locations of the beam leads become visible via the rear side. Use is made of the transparency of the glass support for the infrared radiation. The invention also relates to semiconductor devices manufactured by using a method according to the first aspect or to the second aspect of the invention.

The invention will be described in greater detail with reference to an embodiment of an etching treatment according to the first aspect or to the second aspect of the invention.

A round slice of monocrystalline n-type silicon having a uniform thickness of 250 μm and a diameter of approximately 50 mm is adhered to a flat side of a round pyrex glass plate having a diamete of approximately 60 mm by means of a suitable thermoplastic adhesive and at a temperature of 250°C.

The slice is then etched in an etching bath formed by mixing:

180 ml of concentrated acid (72% by weight of NHO₃), 30 ml of concentrated hydrofluoric acid (50% by weight of HF), and 80 ml of glacial acetic acid (99% by weight of H₃CCOOH), after which very finely divided silicon oxide which is commercially available as "aerosil", is dissolved in the mixture.

Etching may be carried out in a so-called rolling beaker. For that purpose the assembly of slice and support is adhered with the side of the support on a disc-like protective plate, for example of stainless steel, having a diameter of well over 6 cm, by means of a suitable wax melting at low temperature. Said plate protects the side of the glass support remote from the silicon plate.

As a rolling beaker is used a cylindrical beaker of a synthetic material having an inside diameter of approximately 10 cm and which is placed in a rotatable holder in an inclined position, the beaker being rotatable about its axis. The disc-shaped protective plate is placed on the bottom of the beaker with the silicon slice uppermost after which the etching liquid is introduced into the beaker and the beaker is rotated about its axis at a speed in the order of approximately 200 rpm. After etching the slice for 25 minutes, the thickness has decreased of at most 250 $\mu$ to 40 $\mu$, in which the thickness variations of at most 5 $\mu$ occur. Similar results are obtained by etching a second slice with the already used etchant in which the contents of HNO₃ and active HF have been restored.

For comparision with this etching treatments carried out in agreement with the invention, the same process is carried out with a silicon slice of the same type and dimensions but in which no silicon oxide has been dissolved in the fresh etchant of the above mentioned original composition. After etching for 20 minutes the originally smooth surface has become convex, the thickness of the slice at the periphery being approximately 40 $\mu$ and in the center 65 $\mu$.

What is claimed is:

1. A method of etching a semiconductor device in which at least one silicon slice or germanium slice is secured by one side to a sodium containing glass support comprising exposing said device to the action of an etching bath containing hydrofluoric acid, at least one oxidizing agent and an amount of silicon dissolved therein that is at least equivalent to the amount of sodium dissolved from the glass support upon initial contact of said etching bath upon said glass support.

2. A method as claimed in claim 1, characterized in that the content of silicon in the etching bath is obtained by dissolving silica gel.

3. A method as claimed in claim 1, characterized in that the content of silicon is obtained by dissolving very finely divided silicon oxide with a particle size smaller than 0.1 $\mu$ with a corresponding porosity as regards the surface-to-volume ratio.

4. A method as claimed in claim 1, characterized in that some elementary silicon is dissolved in the etchant prior to the etching treatment.

5. A method as claimed in claim 1, for etching silicon slices with an etching bath containing HF and HNO₃, characterized in that the quantity by weight of HNO₃ is more than ⅔ of the quantity by weight of active HF.

6. A method as claimed in claim 5, characterized in that the quantity by weight of HNO₃ is at least equal to the quantity by weight of the active HF.

7. A method as claimed in claim 1, characterized in that the glass support has a coefficient of expansion which differs at most 25% from that of the material of ths slice.

8. A method as claimed in claim 1, characterized in that the slice to be etched has a maximum dimension of at least 2 cm.

9. A method as claimed in claim 1, characterized in that the material of the slice is etched away over a thickness of at least 50 $\mu$.

10. A method as claimed in claim 1, characterized in that on the side facing the glass support the slice has one or more semiconductor circuit elements.

11. A method as claimed in claim 10, characterized in that on the side facing the support the slice has beam-leads.

12. A method as claimed in claim 11, characterized in that the treatment is succeeded by a local anisotropic etching stop for forming grooves penetrating through the slice.

* * * * *